United States Patent [19]
Padoan et al.

[11] Patent Number: 5,600,594
[45] Date of Patent: Feb. 4, 1997

[54] THRESHOLD VOLTAGE MEASURING DEVICE FOR MEMORY CELLS

[75] Inventors: Silvia Padoan, Rimini; Marco Maccarrone, Palestro; Marco Olivo, Bergamo, all of Italy

[73] Assignee: SGS-Thomson Microelectronics S.r.l., Agrate Brianza, Italy

[21] Appl. No.: 412,326

[22] Filed: Mar. 31, 1995

[30] Foreign Application Priority Data

Mar. 31, 1994 [EP] European Pat. Off. .............. 94830156

[51] Int. Cl.$^6$ .................................................. G11C 16/02
[52] U.S. Cl. .................... 365/185.24; 365/185.2; 365/185.21
[58] Field of Search .......................... 365/185.24, 185.2, 365/185.21, 210, 208, 207

[56] References Cited

U.S. PATENT DOCUMENTS

| | | | |
|---|---|---|---|
| 4,253,059 | 2/1981 | Bell et al. | 324/73 R |
| 4,301,535 | 11/1981 | McKenny et al. | 371/21 |
| 4,612,630 | 9/1986 | Rosier | 365/201 |
| 5,039,941 | 8/1991 | Castro | 324/765 |
| 5,396,467 | 3/1995 | Liu | 365/210 |
| 5,420,822 | 5/1995 | Kato | 365/185.2 |
| 5,469,397 | 11/1995 | Hoshino | 365/210 |

FOREIGN PATENT DOCUMENTS 2680585 2/1993 France ............................. G05F 3/16

OTHER PUBLICATIONS

"Current Bias Testing for Memory Cells," *IBM Technical Disclosure Bulletin*, Armonk, New York, U.S.A., vol. 33(3B), pp. 343–344, Aug. 1990.

Tsukude et al., "Highly Reliable Testing of ULSI Memories with On-Chip Voltage-Down Converters," *IEEE Design & Test of Computers*, Los Alamitos, California, U.S.A., vol. 10(2), pp. 6–12, Jun. 1993.

*Primary Examiner*—David C. Nelms
*Assistant Examiner*—Son Mai
*Attorney, Agent, or Firm*—David V. Carlson; Harry K. Ahn; Seed and Berry LLP

[57] ABSTRACT

A circuit device for measuring the threshold voltage distribution among electrically programmable, non-volatile memory cells, which device comprises a differential amplifier having a first input connected to a first circuit leg including at least one memory cell and a second input connected to a second or reference circuit leg, and circuit means effective to cause an unbalance in the values of the currents flowing in the reference leg. The device is connected between a first supply voltage reference and a second voltage reference, and said circuit means comprise a generator of a varying current as a function of the supply voltage which is associated with the reference leg.

24 Claims, 5 Drawing Sheets

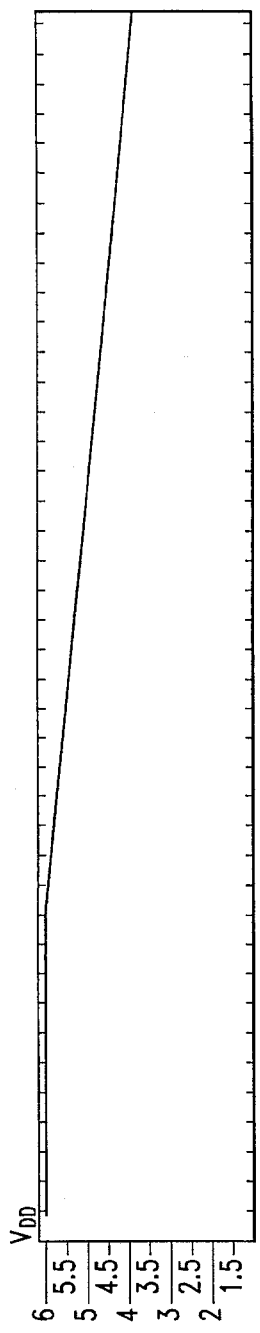
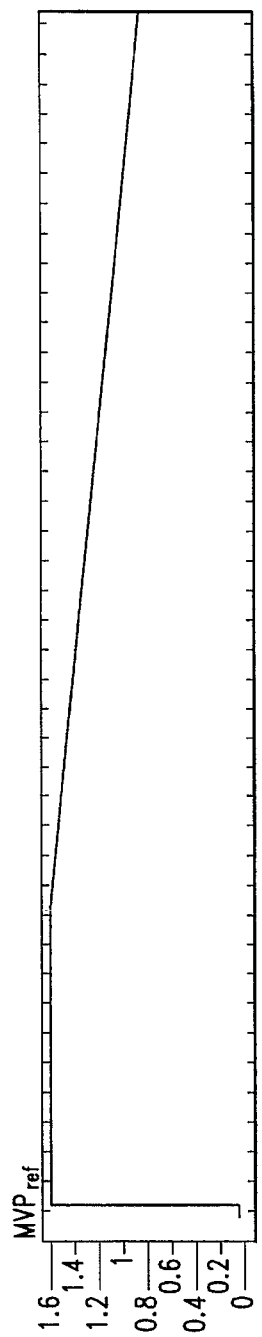
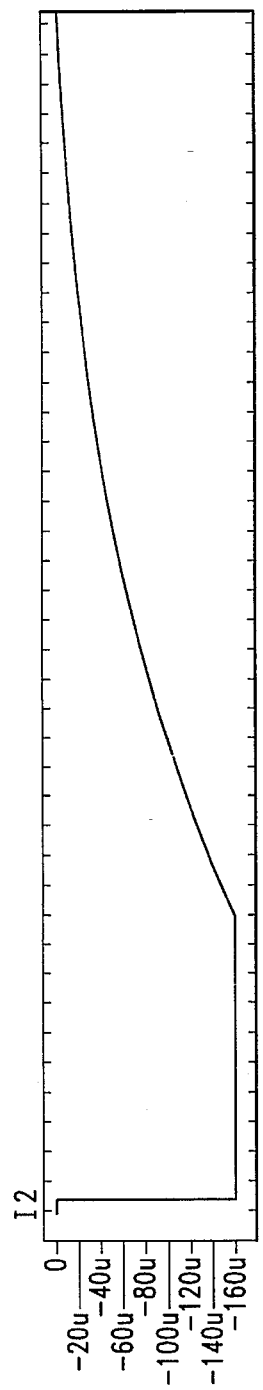
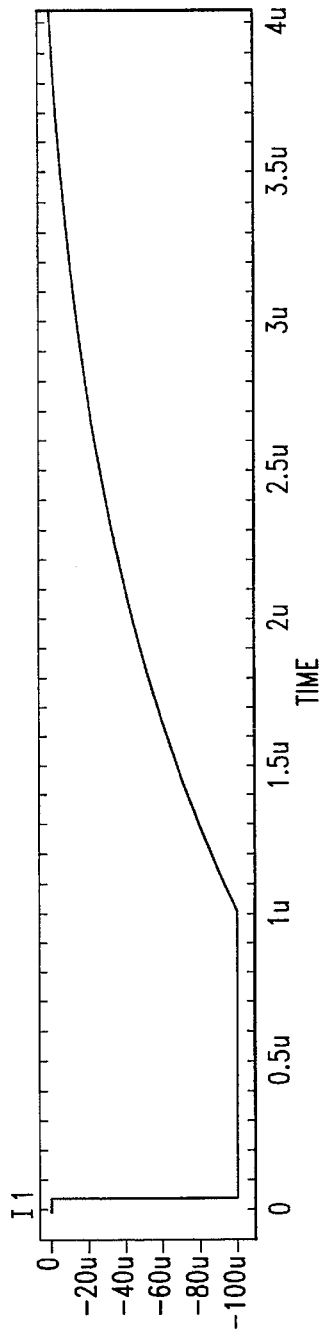
Fig. 5
Fig. 6
Fig. 7
Fig. 8

THRESHOLD VOLTAGE MEASURING DEVICE FOR MEMORY CELLS

TECHNICAL FIELD

This invention relates to semiconductor memory devices, and more particularly, to a circuit device for measuring the threshold voltage distribution among electrically programmable, non-volatile memory cells.

BACKGROUND OF THE INVENTION

A non-volatile memory cell is known to comprise a MOS transistor having a first terminal or floating gate terminal with a high DC impedance and a second terminal or control gate terminal driven by means of control voltages.

By applying suitable voltage values to the cell terminals, the amount of the charge present in the floating gate can be varied and the transistor can be brought to either of two logic states. Thus, the transistor can function as a logic memory element.

As is known, today's electronic memory circuits contain thousands of cells arranged in matrix form and integrated to a semiconductor at very high packing rates.

In circuits of this type, different circuit portions are respectively arranged to perform cell programming, erasing, and reading operations.

For instance, to read the memory cells, a dedicated circuit is normally used which is connected to a so-called "virgin" cell, i.e., a reference cell which has never undergone memory cycles.

In addition to the reference cell, the read circuit comprises a specially responsive differential amplifier, known as the sense amplifier, which includes a two-input comparator. A first input of the comparator is connected to a circuit leg including a cell to be read, whereas the other input is connected to a second leg including the reference cell. The voltage value obtained at the comparator output will correspond to the logic state of the cell.

Cell reading is based, therefore, on an unbalanced condition of the comparator due to the different currents present in the leg of the cell to be read and the leg of the reference cell.

The circuit portion dedicated to cell reading may also be used to perform testing operations which allow the proper operation of the cell matrix to be checked.

Specifically, during a testing step, it is important that the distribution of the threshold voltages $V_T$ among the cells forming the memory matrix can be checked.

It is a current practice to perform this check by obtaining the distribution for the number of cells which, at a given gate voltage Vgate, would cause the sense amplifier to change over.

The test is carried out by adjusting the gate voltage Vgate of the cell matrix. This voltage is provided during this test through an external terminal (pin) other than the supply voltage Vdd terminal. In a memory circuit, that terminal may be the terminal intended to receive the programming voltage Vpp, when applied an appropriate voltage value.

Thereafter, the reference cell is connected to the reference leg and a current Iref flows through the reference cell leg associated with the sense amplifier.

Finally, the value of the voltage being applied to the external terminal is varied, and the current values which appear at the matrix output are sequentially noted, which values will indicate the threshold voltage distribution. Measuring the threshold voltage of a selected memory cell is well-known in the art and are described in detail in U.S. Pat. Nos. 4,253,059 (1981) and 4,301,535 (1981), both of which are incorporated herein by reference.

This invention is related to this specific field of application, and is directed to further improve and facilitate the measurement of this threshold voltage distribution.

SUMMARY OF THE INVENTION

According to principles of the present invention, a circuit is provided for generating a reference current, to be applied to one leg of the sense amplifier, which is a function of the supply voltage Vdd to the cell matrix.

This current is used as a comparison term for the reference leg of the differential amplifier in lieu of the reference cell. Because the current flowing through the reference leg is independent of the reference cell, the present invention makes the measurement of the threshold voltage more reliable.

The features and advantages of the inventive device will be apparent from the following detailed description of an embodiment thereof, given by way of illustration and not of limitation with reference to the accompanying drawings.

BRIEF DESCRIPTION OF THE DRAWINGS

In the drawings:

FIGS. 5 to 8 show a set of graphs having the same time base for electrical signals present in the device of the present invention.

DETAILED DESCRIPTION OF THE INVENTION

Figure 1:
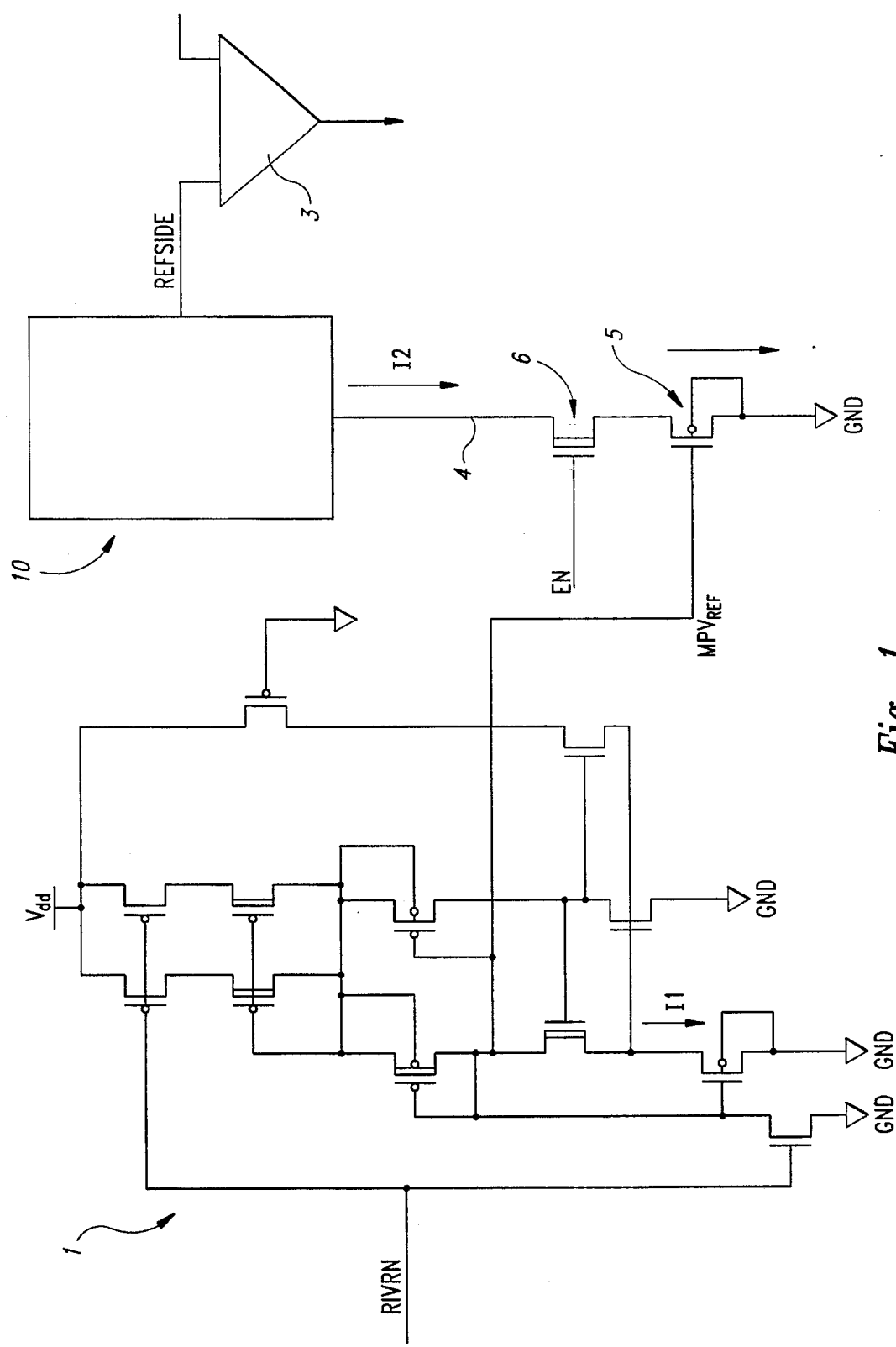
FIG. 1 is a diagrammatic representation of a circuit device according to principles of the present invention.

Referring to FIG. 1, it shows a circuit device according to principles of the present invention for measuring the distribution of the threshold voltages Vg among non-volatile memory cells (not shown). Each memory cell is similar to conventional memory cells of the same type, and need not be shown.

In addition, the cells are arranged in a matrix having a plurality of rows and columns. Aligned along the rows and all connected to a common voltage reference, such as a signal ground GND, are the respective source terminals of the cells. Along the columns, on the other hand, the respective drain terminals are connected together to a bit line.

Figure 2:
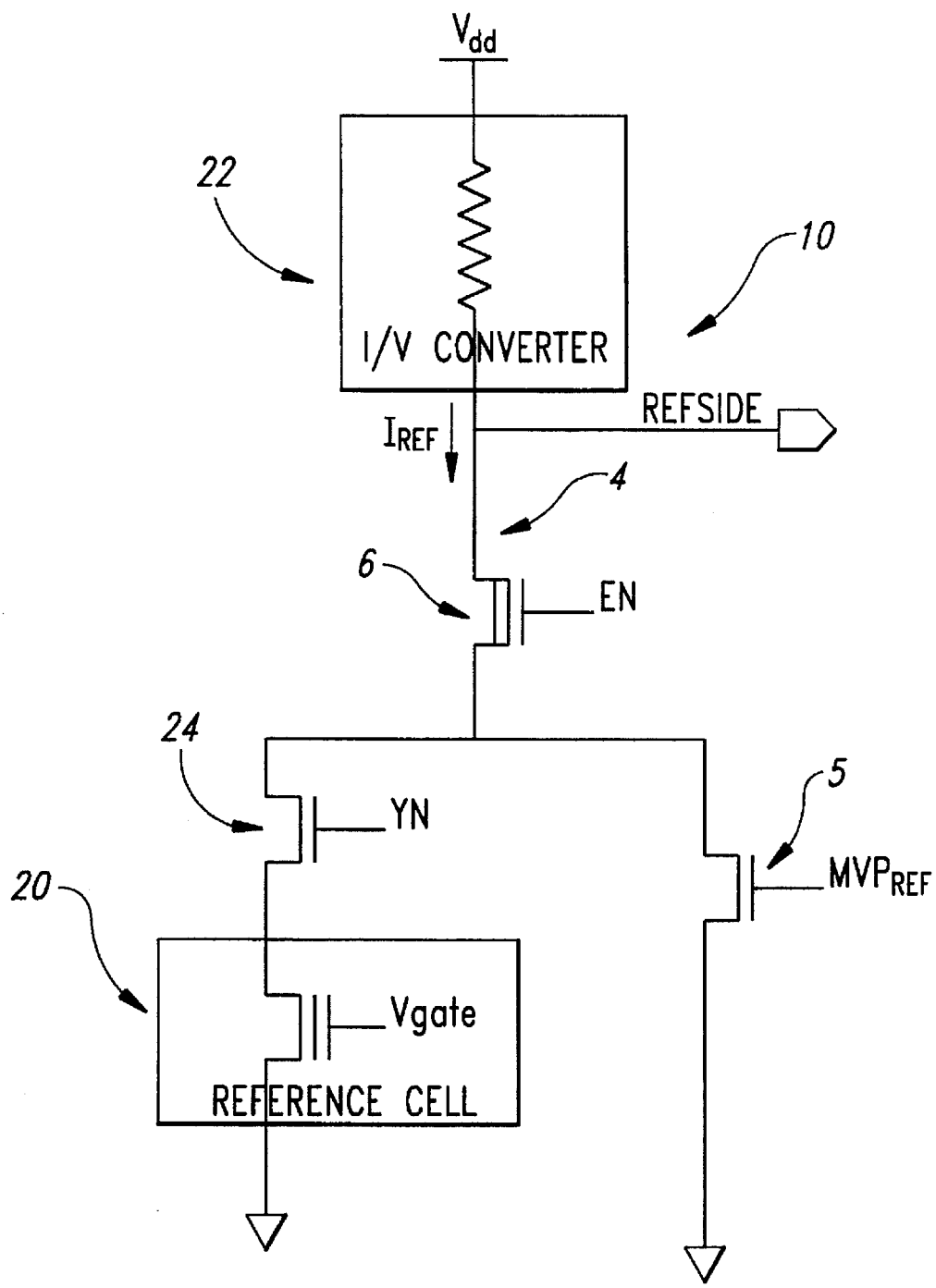
FIG. 2 is a diagrammatic representation of a portion of the circuit device of FIG. 1 showing the current flow through a reference leg.

Referring to FIGS. 1 and 2, the device 1 is adapted to be associated with a specially responsive differential amplifier 3, and is connected between a first supply voltage Vdd and a second voltage reference such as a signal ground GND.

This amplifier 3 has a first input connected to a first circuit leg including at least one memory cell and a second input connected to a second circuit leg 4 which includes at least one selection circuit 10. The selection circuit 10 includes a reference cell and a switching circuit to switch from normal operation mode to threshold testing mode. When in normal operation mode, the signal YN enables the transistor 24 to permit connection of the reference cell 20 to the differential amplifier. The reference cell 20 is usually a virgin cell and is connected serially to a selection transistor 6 of a natural type which receives an enable signal EN on its gate terminal during normal operation. The details of such amplifier circuits 3 and their connection to selected memory cells in the array and use of a reference cell 20 to perform a read as is well known in the art and any conventional circuitry is acceptable for this arrangement during normal read and write operations.

Referring to FIG. 2, it shows in detail one possible circuit for the reference leg of the device 1. During the test mode of the measurement of threshold voltages, the gate terminal YN of cut off transistor 24 goes low and isolates reference cell 20 from the reference leg. EN is held high to conduct the test. The current Iref thus equals the current flowing through the transistor 5. An I/V converter 22 converts the current flowing therethrough into a voltage value on line REFSIDE that is provided to one of the inputs to the differential amplifier 3 and is used to determine the threshold voltage. (Transistors 24 and 20 are within the block 10 in FIG. 1; the transistors 5 and 6 are the same as those shown in FIG. 1.)

The signal MVPref is a value that is a function of the supply voltage Vdd as best shown in FIGS. 5 and 6. The reference current Iref is thus equal to the current that flows through transistor 5 that is controlled by the MVPref signal so its value can be chosen at will during the test mode. Thus, the voltage at REFSIDE is exactly controllable by varying Vdd.

In normal operation mode, however, MVPref at the gate terminal of transistor 5 is low. Thus, reference current Iref is equal to the current flowing through the reference cell 20. The signal RIVRN is an enable and disable signal. It enables the circuit 1 to produce a signal MVPref that is a function of the voltage signal Vdd. It also disables the circuit 1 so that MVPref is zero in the normal operation mode. Signal YN is the same signal as RIVRN in one embodiment; it is a separate signal generated by different circuitry in an alternative embodiment. The invention thus permits switching into a test mode by merely supplying an enable/disable signal without the need for other external voltages.

Shown in FIG. 5 is a sliding voltage level of the supply voltage Vdd pattern vs. time.

Figure 3:
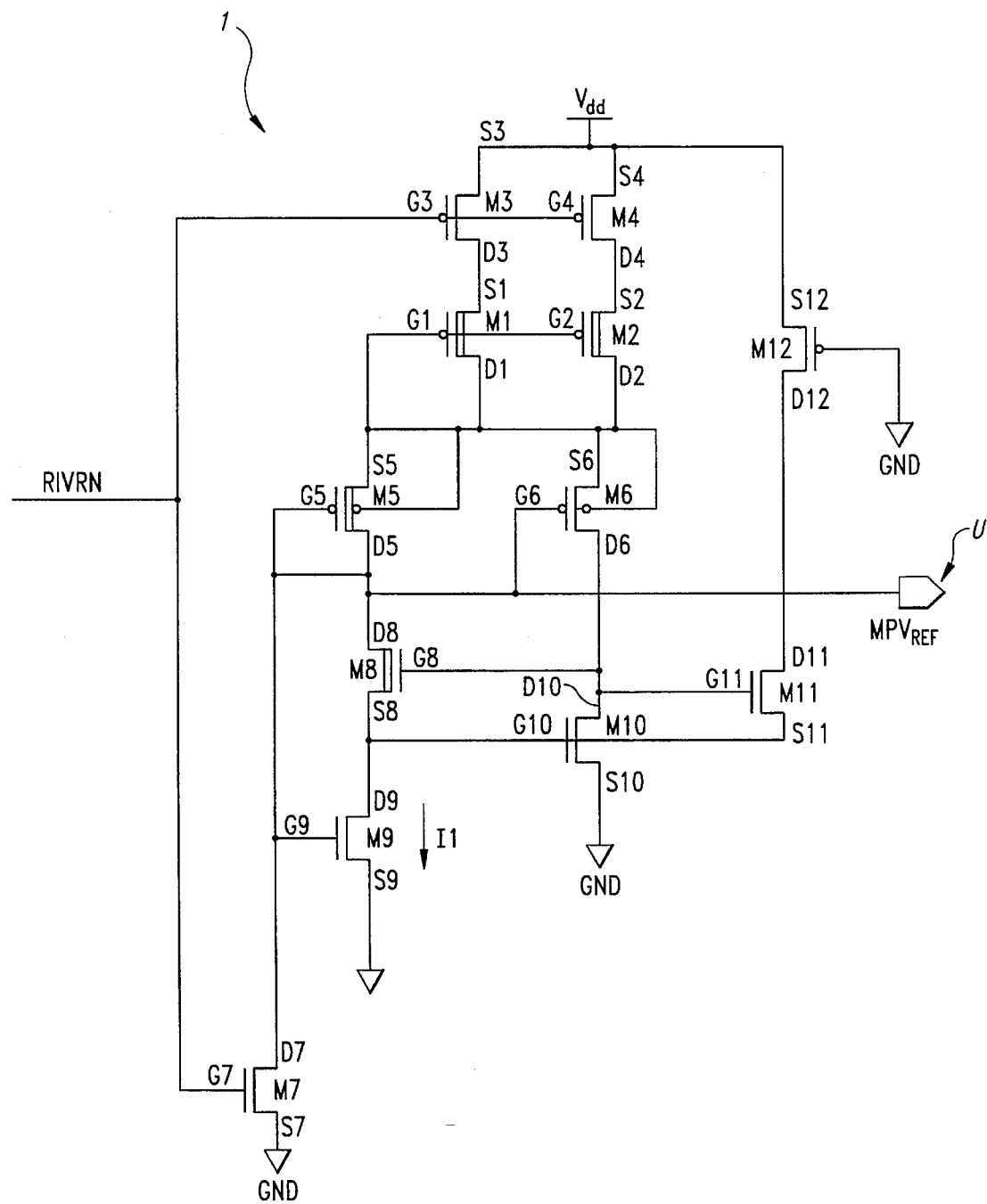
FIG. 3 is a diagrammatic representation of an application of the inventive device to a read circuit for non-volatile memory cells.

Referring now to FIG. 3, the device 1 comprises a first pair of transistors M1 and M2, of the natural P-channel MOS type, which have their respective gate G1, G2 and drain D1, D2 terminals all connected together.

A second pair of transistors M3 and M4, of the P-channel MOS type, are connected to the former pair by the connection of their respective drain terminals D3, D4 and source terminals S1, S2.

The second transistor pair M3, M4 have their gate terminals G3, G4 in common and their source terminals S3, S4 connected to the supply voltage Vdd reference.

A further natural transistor M5 of the P-channel type has its source S5 and body terminals connected to the drain terminals D1 and D2 of the first pair M1, M2. The gate G5 and drain D5 terminals of this transistor M5 are in common and connected to the drain D7 of an N-channel MOS transistor M7 having its source S7 connected to the ground voltage reference GND.

The gate terminal of the transistor M7 and the gate terminals G3, G4 of the transistors M3, M4 forming the second pair are applied a signal RIVRN. This signal RIVRN enables the device 1 when at a logic low. By contrast, when the logic value of the signal RIVRN is high, the device is disabled and the output value pulled to zero.

Closely associated with the transistor M5 is another P-channel MOS transistor M6 having respective source S6 and body terminals connected to the drain terminals D1 and D2 of the first pair.

The gate terminal G6 of this transistor M6 is connected to the drain terminal D5 of the transistor M5, and forms with it an output terminal U of the device 1 for producing a voltage value MVPref.

The drain D6 of the transistor M6 is led to ground through a transistor M10 of the N-channel MOS type having a source terminal S10 connected to ground.

The gate G10 and drain D10 of this transistor M10 are connected respectively to the source S8 and the gate G8 of a natural N-channel MOS transistor M8 having its drain terminal D8 connected to the output U.

The transistor M8 is connected serially to transistor M9 of the N-channel type which has its gate terminal G9 connected to the drain D7 of the transistor M7.

Finally, a transistor M11 of the N-channel MOS type has its source S11 and gate G11 terminals in common with the gate G10 and the drain D10, respectively. The drain D11 of the transistor M11 is connected to the drain terminal D12 of a P-channel MOS transistor M12 having its gate terminal G12 grounded and its source S12 connected to the supply voltage Vdd reference. The gate G12 could also receive the signal RIVRN.

Referring back to FIG. 1, the device 1 having an output terminal U acts as a voltage shifter and the voltage output MVPref at the terminal U of the device 1 is connected to the gate terminal of an N-channel MOS transistor 5 to impress a current value I2 on the circuit leg 4 which can be modulated with the supply voltage Vdd. Thus, the device 1 comprises a variable voltage generator and the device 1 and the transistor 5 comprise a variable current generator that generates a sliding current value I2 according to the present invention.

In particular, a proportional voltage MVPref to the supply voltage Vdd is produced at the output terminal U, as shown in FIG. 6. By application of that voltage to the gate of the transistor 5, a current I2=f(Vdd) is produced which will flow through the leg 4 to a pattern as shown in FIG. 7.

This current substantially replaces the current which is normally flowed through the reference cell column, to become the new comparison term for the input of the differential amplifier 3 connected to the leg 4. The threshold voltage of the memory cell is measured when the output of the differential amplifier 3 switches its logic state.

In this way, it also becomes possible to evaluate the maximum current value I2 that flows on the reference branch which allows a memory cell to be read as virgin at a predetermined gate voltage Vgate, such a current corresponding to the one flowing on the virgin cell for that gate.

Since the output voltage MVPref of the device 1 varies as the supply voltage Vdd varies within the 6 V to 3.5 V range of values, all this will reflect on the value of the current I1 flowing through the transistor M9 as shown in FIG. 8.

The current I1 is mirrored in the circuit leg 4, and this makes the value of the current I2 suitable for modulation with the supply voltage Vdd. The output terminal U in turn supplies the gate terminal of transistor 5 with the same voltage. For example, FIG. 6 shows MVPref at 1.6 V when Vdd is 6 V.

Figure 4:
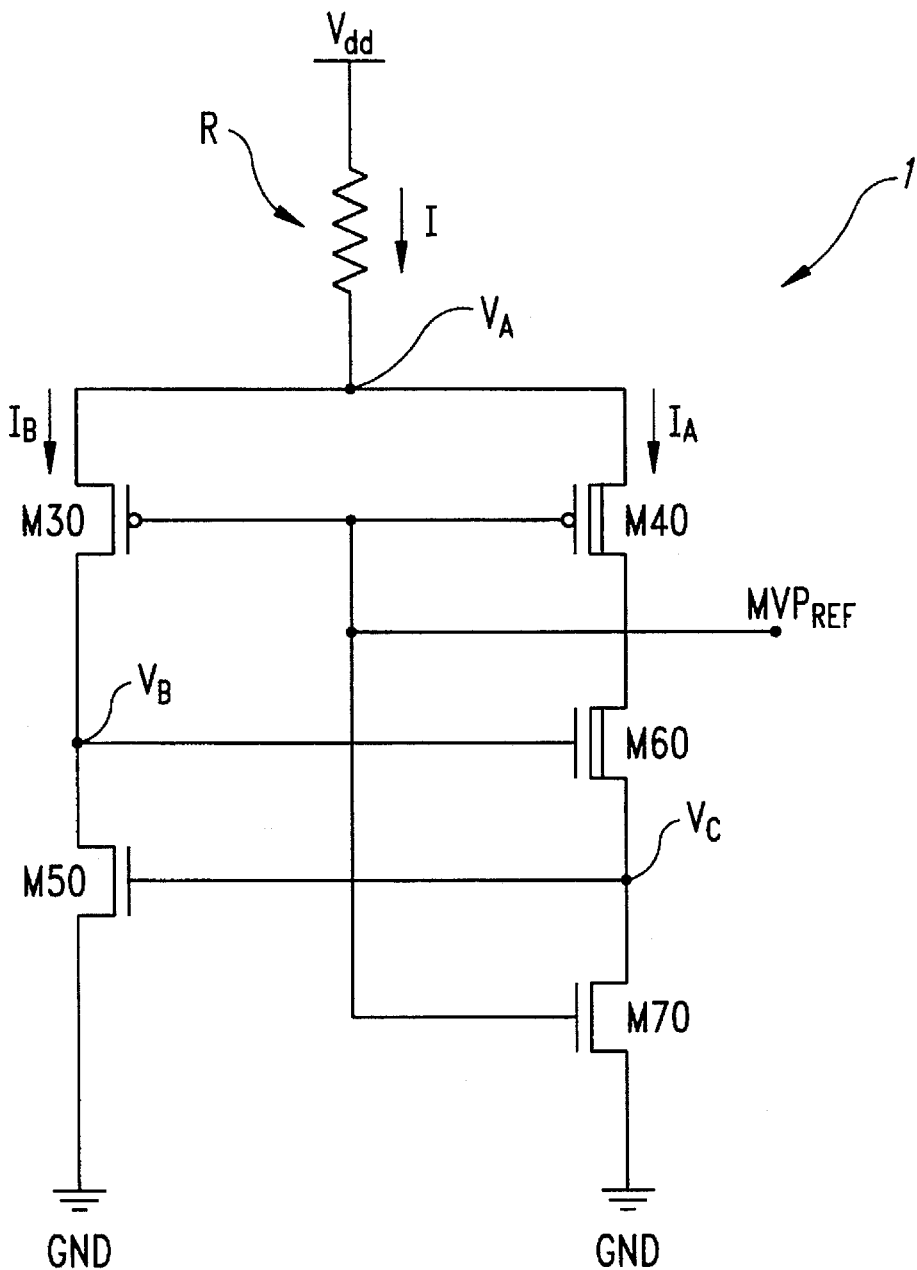
FIG. 4 is a simplified circuit diagram of FIG. 3.

Referring to FIG. 4, it shows a simplified circuit diagram of FIG. 3. From the circuit, the following set of equations may be obtained:

I(M40)=I(M60)

I(M60)=I(M70)

I(M30)=I(M50)

I(M40)+I(M30)=(Vdd−$V_A$)/R

The devices sizes and impedance values of the transistors and R are selected such that when Vdd varies over the range of 2 to 6 volts, the signal MVPref tracks Vdd. One of skill in the art could select the desired device characteristics and calculate $V_A$, $V_B$, $V_C$, and MVPref based on these device characteristics over the range of Vdd.

The present invention provides a voltage MVPref for testing the threshold voltages of the memory cell transistor solely from a single power supply, Vdd. In the prior art, an external voltage was required to be supplied from off the chip to perform this measurement. The present invention thus provides a circuit on the chip that replaces the need for this external voltage.

Two examples of this circuit are shown in FIG. 3 and FIG. 4. Modifications may be made to these circuits within the spirit of this invention to provide an on-chip generated reference signal on REFSIDE that is directly controllable from MVPref, and hence from Vdd without the need for external voltage for this purpose.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

We claim:

1. A circuit device for measuring the threshold voltage distribution among electrically programmable, non-volatile memory cells, the circuit device comprising:

a differential amplifier having a first input connected to a first circuit leg that is connectable to at least one memory cell and a second input connected to a reference circuit leg, and a variable current generator that generates at its output a varying current value, the output of the variable current generator being connected to the reference circuit leg to provide the varying current value thereto to measure the threshold voltage of the memory cell connected to the first input of the differential amplifier.

2. A circuit device according to claim 1 wherein said variable current generator receives a supply voltage and produces on said reference circuit leg the varying current value which is a function of said supply voltage.

3. A circuit device according to claim 1 wherein the variable current generator comprises at least one transistor connected to the reference circuit leg, and a voltage generator having an output connected to the control terminal of said transistor.

4. A circuit device according to claim 1 wherein said variable current generator comprises:

a first pair of natural transistors having their respective gate and drain terminals all connected together;

a second pair of transistors of the P-channel MOS type connected to the first pair by connecting their respective drain and source terminals, said second pair having their gate terminals in common and source terminals connected to the supply voltage; and a further natural transistor of the P-channel MOS type having its source and body terminals connected to the drain terminals of the first pair.

5. A circuit device according to claim 4 wherein the gate and drain terminals of said further natural transistor are in common and connected to the drain of an N-channel MOS transistor having its source connected to the ground voltage reference, the gate terminal of the N-channel MOS transistor and the gate terminals of the transistors which comprise the second pair being applied a device enable/disable signal.

6. A circuit device according to claim 4 wherein, provided in close association with said further natural transistor, is another transistor of the P-channel MOS type having its respective source and body terminals connected to the drain terminals of the first pair and its gate terminal connected to the drain terminal of said further natural transistor.

7. A circuit device according to claim 6 wherein the drain of said another transistor is led toward ground via an N-channel MOS transistor having its source terminal connected to ground, and that the gate and drain of the last-mentioned transistor are respectively coupled to the source and the gate of a fourth natural transistor of the N-channel MOS type having its drain terminal connected to the drain terminal of said further natural transistor.

8. A circuit device according to claim 7 wherein the fourth natural transistor is connected, serially toward ground, to an N-channel MOS transistor having its gate terminal connected to the gate of said further natural transistor.

9. A circuit device according to claim 7 wherein the variable current generator further comprises a transistor of the N-channel MOS type having its respective source and gate terminals in common with the gate and the drain of said last-mentioned transistor, and its drain terminal in common with the drain terminal of a P-channel MOS transistor the source whereof is connected to the supply voltage.

10. In an integrated circuit including a plurality of memory cells, a device for measuring a threshold voltage of at least one of the plurality of memory cells, the device comprising:

a differential amplifier having a first input and a second input;

a circuit leg for connecting at least one memory cell to the first input;

a reference leg connected to the second input; and a variable current generator that generates at its output a varying current value, the output of the variable current generator being connected to the reference leg to provide the varying current value thereto to measure the threshold voltage of the memory cell connected to the first input.

11. The device according to claim 10 wherein the variable current generator is connected to a voltage supply source and produces the varying current value as a function of the voltage of the voltage supply source.

12. The device according to claim 10 wherein the variable current generator includes:

a transistor connected to the reference leg; and a voltage generator connected to a control terminal of the transistor to control the amount of current flowing through the reference leg.

13. The device according to claim 10 wherein the variable current generator includes:

first and second natural transistors whose gate terminals and the drain terminals are all connected to each other;

a third transistor of P-channel MOS type connected between the first transistor and a voltage supply source;

a fourth transistor of P-channel MOS type connected between the second transistor and the voltage supply source, the gate terminals of the third and fourth transistors being connected to each other; and a fifth transistor of natural P-channel MOS type whose source and body terminals are connected to the drain terminals of the first and second natural transistors.

14. The device according to claim 13 wherein the variable current generator further includes:

a sixth transistor connected between the fifth transistor and ground, the gate and drain terminals of the fifth transistor being connected to each other, wherein the gate terminals of the third, fourth and sixth transistors are connected to each other and are used to turn on the variable current generator.

15. The device according to claim 13 wherein the variable current generator further includes a seventh transistor of natural P-channel MOS type whose source and body terminals are connected to the drain terminals of the first and second natural transistors.

16. The device according to claim 15 wherein the variable current generator further includes:

an eighth transistor of N-channel MOS type connected between ground and the seventh transistor; and a ninth transistor of N-channel MOS type connected between the drain terminal of the fifth transistor and the gate terminal of the eighth transistor, the gate terminal of the ninth transistor being connected to the drain terminal of the eighth transistor.

17. The device according to claim 16 wherein the variable current generator further includes a tenth transistor of N-channel MOS type connected between ground and the ninth transistor.

18. The device according to claim 17 wherein the variable current generator further includes:

an eleventh transistor of N-channel MOS type whose gate and source terminals are connected respectively to the drain and gate terminals of the eighth transistor; and a twelfth transistor of P-channel MOS type connected between the voltage supply source and the eleventh transistor.

19. In an integrated circuit including a plurality of non-volatile memory cells, a device for measuring a threshold voltage of at least one of the plurality of memory cells, the device comprising:

a differential amplifier having a first input and a second input;

a circuit leg for connecting to the first input at least one memory cell whose threshold voltage is to be measured;

a reference leg connected to the second input;

a variable current generator that provides a variable current through the reference leg during a threshold voltage measurement of the connected memory cell; and a switch connected between the reference leg and a reference cell, the switch being operable to isolate the reference cell from the reference leg during the threshold voltage measurement.

20. The device according to claim 19 wherein the variable current generator includes:

a voltage shifter that receives a supply voltage and generates a voltage value proportional to the supply voltage.

21. The device according to claim 20 wherein the variable current generator further includes a transistor connected to the reference leg wherein a control terminal of the transistor is connected to the variable current generator to provide the variable current as a function of the voltage value of the voltage shifter.

22. The device according to claim 19, further comprising:

a current to voltage converter connected to both the current generator and the reference leg to provide at its output a voltage value as a function of the variable current.

23. A circuit device for measuring the threshold voltage distribution among electrically programmable, non-volatile memory cells, the circuit device comprising:

a differential amplifier having a first input connected to a first circuit leg that is connectable to at least one memory cell and a second input connected to a reference circuit leg, and a variable current generator connected to the reference circuit leg and operable to cause an unbalance in the values of the currents being respectively flowed through each of said circuit legs, the variable current generator including a first pair of natural transistors having their respective gate and drain terminals all connected together;

a second pair of transistors of the P-channel MOS type connected to the first pair by connecting their respective drain and source terminals, said second pair having their gate terminals in common and source terminals connected to a supply voltage; and a further natural transistor of the P-channel MOS type having its source and body terminals connected to the drain terminals of the first pair.

24. In an integrated circuit including a plurality of memory cells, a device for measuring a threshold voltage of at least one of the plurality of memory cells, the device comprising:

a differential amplifier having a first input and a second input;

a circuit leg for connecting at least one memory cell to the first input;

a reference leg connected to the second input; and a variable current generator connected to the reference leg and operable to cause an imbalance in the current flowing through the circuit leg and the reference leg, the variable current generator including:

first and second natural transistors whose gate terminals and the drain terminals are all connected to each other;

a third transistor of P-channel MOS type connected between the first transistor and a voltage supply source;

a fourth transistor of P-channel MOS type connected between the second transistor and the voltage supply source, the gate terminals of the third and fourth transistors being connected to each other; and a fifth transistor of natural P-channel MOS type whose source and body terminals are connected to the drain terminals of the first and second natural transistors.

* * * * *